US008261690B2

(12) United States Patent
Doolittle et al.

(10) Patent No.: US 8,261,690 B2
(45) Date of Patent: Sep. 11, 2012

(54) IN-SITU FLUX MEASUREMENT DEVICES, METHODS, AND SYSTEMS

(75) Inventors: W. Alan Doolittle, Hampton, GA (US); Alexander G. Carver, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1341 days.

(21) Appl. No.: 11/778,418

(22) Filed: Jul. 16, 2007

(65) Prior Publication Data

US 2008/0047487 A1    Feb. 28, 2008

Related U.S. Application Data

(60) Provisional application No. 60/830,898, filed on Jul. 14, 2006.

(51) Int. Cl.
*C23C 16/448* (2006.01)
*C23C 16/452* (2006.01)
*C23C 16/52* (2006.01)
*C23F 1/00* (2006.01)
*H01L 21/306* (2006.01)
*C23C 16/06* (2006.01)
*C23C 16/22* (2006.01)

(52) U.S. Cl. .. 118/712; 118/715; 118/726; 118/723 VE; 118/723 CB; 118/723 EB

(58) Field of Classification Search ................. 118/712, 118/715, 726, 723 VE, 723 CB, 723 EB; 156/345.1
See application file for complete search history.

(56) References Cited

U.S. PATENT DOCUMENTS

| | | | | | |
|---|---|---|---|---|---|
| 2,310,766 | A | * | 2/1943 | Dornauf | 164/119 |
| 2,848,523 | A | * | 8/1958 | Hanks et al. | 373/26 |
| 3,699,334 | A | * | 10/1972 | Cohen et al. | 250/492.2 |
| 3,928,092 | A | * | 12/1975 | Ballamy et al. | 438/403 |
| 3,974,059 | A | * | 8/1976 | Murayama | 204/298.05 |
| 4,115,163 | A | * | 9/1978 | Gorina et al. | 117/103 |
| 4,217,855 | A | * | 8/1980 | Takagi | 118/719 |
| 4,224,099 | A | * | 9/1980 | McGill | 117/19 |
| 4,450,031 | A | * | 5/1984 | Ono et al. | 156/345.39 |
| 4,523,971 | A | * | 6/1985 | Cuomo et al. | 156/345.39 |
| 4,791,261 | A | * | 12/1988 | Phinney et al. | 219/634 |
| 4,800,100 | A | * | 1/1989 | Herbots et al. | 427/527 |

(Continued)

FOREIGN PATENT DOCUMENTS

JP     03229861  A  *  10/1991

OTHER PUBLICATIONS

Google Search, www.google.com.*

*Primary Examiner* — Rudy Zervigon
(74) *Attorney, Agent, or Firm* — Troy S. Kleckley; Troutman Sanders LLP

(57) ABSTRACT

In-situ flux measurement methods, devices, and systems are provided. According to some embodiments, an in-situ molecular flux device generally comprises a electrically conductive container configured to hold a precursor material, a heat source proximate the electrically conductive container to heat the precursor material to release ions such that an ion current is produced; and a current-measuring device in electrical communication with the electrically conductive container to measure the ion current associated with the heated precursor material. Other embodiments are also claimed and described.

6 Claims, 9 Drawing Sheets

U.S. PATENT DOCUMENTS

| | | | |
|---|---|---|---|
| 4,812,326 A * | 3/1989 | Tsukazaki et al. | 427/562 |
| 4,877,479 A * | 10/1989 | McNeil et al. | 216/60 |
| 5,098,675 A * | 3/1992 | Matsuo et al. | 117/213 |
| 5,099,791 A * | 3/1992 | Tsukazaki et al. | 118/723 CB |
| 5,211,994 A * | 5/1993 | Tsukazaki et al. | 427/523 |
| 5,237,182 A * | 8/1993 | Kitagawa et al. | 257/15 |
| 5,330,729 A * | 7/1994 | Oda et al. | 117/217 |
| 5,399,521 A | 3/1995 | Celii et al. | |
| 5,540,780 A * | 7/1996 | Haas et al. | 118/715 |
| 5,598,260 A | 1/1997 | Brewer et al. | |
| 5,616,180 A * | 4/1997 | Lee et al. | 118/715 |
| 5,657,335 A * | 8/1997 | Rubin et al. | 372/44.01 |
| 5,820,680 A * | 10/1998 | Miyamoto et al. | 118/723 EB |
| 6,120,857 A * | 9/2000 | Balooch et al. | 427/596 |
| 6,162,296 A * | 12/2000 | Kohara et al. | 118/666 |
| 6,202,591 B1 * | 3/2001 | Witzman et al. | 118/723 VE |
| 6,355,910 B1 * | 3/2002 | Seidl et al. | 219/426 |
| 6,513,451 B2 * | 2/2003 | Van Slyke et al. | 118/723 VE |
| 6,686,595 B2 * | 2/2004 | Horsky | 250/427 |
| 7,023,138 B2 * | 4/2006 | Horsky | 315/111.81 |
| 7,107,929 B2 * | 9/2006 | Horsky et al. | 118/723 CB |
| 7,829,154 B2 * | 11/2010 | Kobayashi et al. | 427/483 |
| 2001/0022272 A1 * | 9/2001 | Plester et al. | 204/192.38 |
| 2008/0047487 A1 * | 2/2008 | Doolittle et al. | 118/712 |

* cited by examiner

IN-SITU FLUX MEASUREMENT DEVICES, METHODS, AND SYSTEMS

CROSS-REFERENCE TO RELATED APPLICATION & PRIORITY CLAIM

This patent application claims priority to, and the benefit of, U.S. Provisional Patent Application No. 60/830,898 filed on 14 Jul. 2006, and entitled "In-Situ Molecular Flux Measurement Device and Method," which is hereby incorporated by reference as if fully set forth below in its entirety.

TECHNICAL FIELD

The various embodiments of the present invention relate generally to the growth or deposition of thin films, and more particularly, to devices and processes for measuring flux from precursor sources in thin film deposition systems, and to systems for depositing thin films using the flux measuring devices and processes.

BACKGROUND

Thin film deposition techniques require precise control of deposition parameters to produce the complex structures demanded for current and next generation applications. For example, molecular beam epitaxy (MBE) is a versatile technique for depositing single-crystal semiconducting, insulating, or metallic materials used in fabricating state-of-the-art electronic and opto-electronic devices. The advantages of MBE over other growth techniques include the ability to produce high purity materials with controlled composition, layer thickness, dopant concentrations, and structure. MBE growth is achieved by directing the output of effusion cells onto a heated substrate in an ultra-high vacuum (UHV) chamber. An effusion cell's output includes atoms and molecules of the desired growth and doping constituents that are to be deposited on the substrate.

MBE practitioners have long sought real-time, or in-situ, control of growth rates and composition of the deposited material. Although MBE offers the potential for growth of device structures with atomic layer precision, current so-called "dead reckoning" methods employed for controlling effusion cell fluxes place limitations on the extent to which the desired composition, thickness and layer uniformity can be achieved. In-situ monitoring and control of these parameters hold the keys to achieving higher accuracy in attaining target growth structures and improved run-to-run reproducibility. Current generation MBE machines rely on pre-growth calibrations such as ion gauge pressure flux measurements, quartz crystal monitors (QCM) or reflection high energy electron diffraction (RHEED) oscillations to determine proper flux conditions. These methods are time-consuming, provide no real-time feedback, and are only marginally accurate when growing demanding structures. These problems directly increase device manufacturing costs.

A few methods of providing true real-time feedback have been proposed. For example, one such class of techniques is based on optical flux monitoring (OFM). OFM detects changes in transmitted light intensity from absorption by the atoms emitted from the effusion cell. However, transmission changes in the OFM system that are not due to flux changes of the atomic beam are often detected as well. In addition, the atomic flux is measured near the surface of the substrate. This geometry is not optimal for several reasons. The foremost problem is that the transmitted light intensity is affected by atoms reflected or desorbed from the substrate surface. Monitoring atomic flux at close proximity to a substrate allows double counting of atoms if they have non-unity sticking coefficients. Also, the atomic flux is not monitored continuously. With these OFM approaches, there is no signal when the effusion cell shutter is closed. This necessitates "dead-reckoning" based upon effusion cell temperature data to infer initial flux conditions after the shutter is opened. An additional shortcoming of existing OFM detection geometries is that, owing to the divergent nature of the effusive source, an OFM signal is measured just above the substrate, where the number of atoms crossing the optical path is lowest. Finally, implementing OFM on existing MBE machines requires substantial re-working of the vacuum chamber and cryopanels.

Accordingly, there remains a need for improved methods and devices for measuring flux from effusion cells in MBE systems. It would be particularly advantageous if such methods and devices could be used with other thin film depositions systems and techniques. It is to the provision of such methods and devices that the various embodiments of the present invention are directed. More specifically, it is to the provision of methods and devices for the in-situ measurement of flux from precursor sources in a variety of thin film deposition systems, as well as the associated thin film depositions systems employing these methods and devices, that the various embodiments of the present invention are directed.

BRIEF SUMMARY

Various embodiments of the present invention are directed to devices used to measure in real time the flux from a precursor source in a thin film deposition system. Some embodiments are also directed to methods of using such devices. Still some other embodiments are directed to the thin film deposition systems that employ such methods and devices.

Broadly described, a device that can be used to measure flux in-situ includes an electrically conductive container configured to hold a precursor or source material, a heat source, and a current-measuring device. The heat source is proximate the electrically conductive container, and provides heat to the precursor material so that the precursor material releases ions. These released ions produce an ion current; that the current-measuring device, which is in electrical communication with the electrically conductive container, can measure. In some embodiments, the device is an effusion cell for a molecular beam epitaxy system.

In some embodiments, the device can include an input signal that is provided to the electrically conductive container. The input signal can have a predetermined phase, and the current-measuring device can be configured to measure the ion current at the predetermined phase of the input signal. In other embodiments, the device can include a vacuum coupler in addition to the input signal. The vacuum coupler can be disposed between the input signal and the electrically conductive container to couple the input signal and the electrically conductive container. The vacuum coupler can be configured to maintain a vacuum during the flux measurement. One example of a vacuum coupler can be a tri-axial feed-through, which, for example, can have a first portion and a second portion that are engagable in a clam-shell configuration for maintaining the vacuum.

The device can include a controller that is in operative communication with the current-measuring device. The controller can also be in operative communication with the heat source. In this fashion, the controller can control the heat source in response to the measured current that is associated with the heated precursor material.

The device can also include a dielectric shield that surrounds at least a portion of the electrically conductive container. An outer electrically conductive layer can surround the dielectric shield as well.

Other embodiments are directed towards methods of measuring flux. For example, a method of measuring flux in-situ can include heating a precursor material in an electrically conductive container, releasing ions from a surface of the heated precursor material effective to produce a current in the precursor material, and measuring the current in the precursor material using a current-measuring device.

The method can also include providing a bias voltage to the electrically conductive container. The bias voltage is effective to bias the precursor material with a voltage of a known frequency. In addition, the bias voltage can be effective to inhibit thermionic emission of electrons from the surface of the heated precursor material. The known frequency can be provided to a lock-in amplifier, such that the current can be measured at the known frequency.

The current can be inhibited from leaking from the electrically conductive container. For example, a bias voltage can be provided to a second electrically conductive container that is disposed about a dielectric shield that, in turn, is disposed about an outer portion of the electrically conductive container in which the precursor material is heated. The bias voltage that is provided to the second electrically conductive container can be identical or substantially identical to the bias voltage provided to the electrically conductive container in which the precursor material is heated. In this manner, there is little or no current leakage from the electrically conductive container in which the precursor material is heated.

The method can also include correlating the measured current (from the released ions) to a neutral atomic flux or neutral molecular flux of the precursor material. This correlation can be made using RHEED growth rate oscillations, a measured flux from an ion gauge flux monitor or quartz crystal monitor, a measured growth rate from thickness and time under conditions of negligible re-desorption, or the like, or a combination including more than one of the foregoing.

Still other embodiments are directed to a thin-film deposition system. An exemplary thin-film deposition system includes a vacuum chamber, a substrate within the vacuum chamber, an electrically conductive container, a heat source, and a current-measuring device. The electrically conductive container can be configured to hold a precursor material. The electrically conductive container can be at least partially disposed in, or comprise a portion of, the vacuum chamber. The heat source can be in operative communication with the electrically conductive container, and can be configured to heat the precursor material such that ions are released from the precursor material. The current-measuring device can be in electrical communication with the electrically conductive container. It can be used to measure a current associated with the released ions of the heated precursor material to provide an in-situ flux of atoms or molecules of the precursor material leaving the electrically conductive container for deposition on the substrate.

The system can also include a controller that is in operative communication with the current-measuring device, the substrate, the vacuum chamber, the heat source, the electrically conductive container, or a combination of more than one of above. The controller can be configured to control a deposition parameter in response to the measured current associated with the released ions of the heated precursor material. The system can also include a power source that is in operative communication with the electrically conductive container. The power source can be configured to provide a bias voltage to the electrically conductive container such that precursor material is biased with the voltage.

The electrically conductive container of the system can include a dielectric shield that surrounds a portion of the electrically conductive container. It can also include an outer electrically conductive layer that surrounds the dielectric shield. Both the electrically conductive container and the outer electrically conductive layer can be in operative communication with a power source.

Additional electrically conductive containers can be configured to hold additional precursor materials. The additional electrically conductive containers can be in operative communication with the same or a different heat source that is configured to heat the additional precursor materials such that ions are released from the additional precursor materials. The additional electrically conductive containers can be in operative communication with the same or a different current-measuring device that measures a current associated with the released ions of the heated additional precursor materials to provide an in-situ flux of atoms or molecules of each of the additional precursor materials leaving the additional electrically conductive containers for deposition on the substrate.

The system can also include a tri-axial feed-through. The tri-axial feed-through can be configured to maintain a vacuum in the vacuum chamber and minimize any affects of noise, cross-talk, and/or interference on the current measured by the current measuring device. The tri-axial feed-through can include a first portion and a second portion that are engageable with one another to provide a signal to the electrically conductive container under vacuum. The tri-axial feed-through can include three conductors. One of the three conductors can be in electrical communication with the vacuum chamber. The other two conductors can be in electrical communication with the electrically conductive container.

Other aspects and features of embodiments of the present invention will become apparent to those of ordinary skill in the art, upon reviewing the following detailed description in conjunction with the accompanying figures.

BRIEF DESCRIPTION OF THE DRAWINGS

The various embodiments of the invention can be better understood with reference to the following drawings. The components in the drawings are not necessarily to scale, emphasis instead being placed upon clearly illustrating the principles of the various embodiments of the present invention. In the drawings, like reference numerals designate corresponding parts throughout the several views.

DETAILED DESCRIPTION OF PREFERRED & ALTERNATIVE EMBODIMENTS

Figure 1:
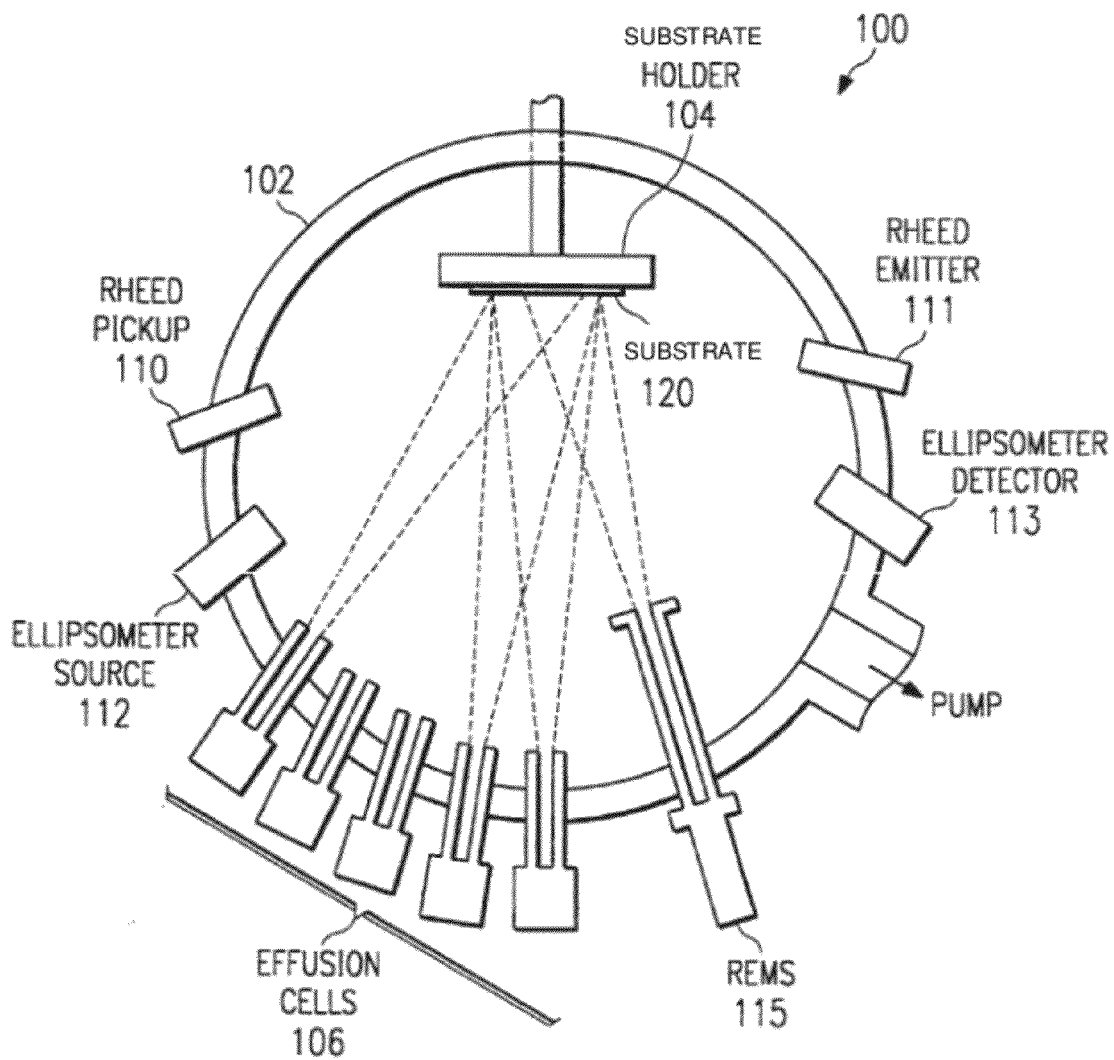
FIG. 1 is a schematic illustration of a molecular beam epitaxy system.

Referring now to the figures, wherein like reference numerals represent like parts throughout the several views, exemplary embodiments of the present invention will be described in detail. Throughout this description, various components may be identified having specific values or parameters, however, these items are provided as exemplary embodiments. Indeed, the exemplary embodiments do not limit the various aspects and concepts of the present invention as many comparable parameters, sizes, ranges, and/or values may be implemented. The terms "first," "second," and the like, "primary," "secondary," and the like, do not denote any order, quantity, or importance, but rather are used to distinguish one element from another. The terms "a", "an", and "the" do not denote a limitation of quantity, but rather denote the presence of "at least one" of the referenced item. Further, the contents of all patents, patent application publications, journal publications, and the like, are expressly incorporated herein in their entireties as if fully set forth below.

The problems, in part, associated with prior attempts at measuring flux in thin film deposition systems are overcome by employing a current-measuring device for each precursor source. This allows for an in-situ, quantitative measurement of the flux of atoms or molecules leaving the precursor source rather than arriving at a substrate. Advantageously, the measurement technique results in the ability to more accurately measure and control the flux. For example, an increase in sensitivity of up to 6 significant figures can be attained.

Reference will now be made to a molecular beam epitaxy (MBE) system for convenience only. Those skilled in the art to which this disclosure pertains, however, will recognize that the methods and devices described below will be applicable to other thin film deposition systems. FIG. 1 schematically illustrates a simple MBE system 100, which includes a vacuum chamber 102. The vacuum chamber 102 includes a substrate holder 104, which may be configured to move or rotate, and one or more effusion cells 106 aimed at the substrate holder 104. Substrate holder 104 can include a heater and/or thermocouple to control and and/or monitor the temperature of the substrate 120. A pump maintains the vacuum chamber 102 at a low pressure during growth such that atoms and molecules have a mean free path larger than the diameter of vacuum chamber 102.

In operation of MBE system 100, each effusion cell 106 is loaded with a specific quantity of a source or precursor material that is required to grow the desired composition on substrate 120. The material that is deposited on the substrate can have the same composition as the substrate (i.e., homoepitaxial growth) or can be different from that of the substrate (i.e., heteroepitaxial growth); that is, for example, both SiC and GaN can be grown on a SiC substrate. To grow a layer, the shutter(s) of the particular effusion cell(s) 106 is opened and a so-called "beam" of the precursor(s) impinges on substrate 120. Ideally, the atoms/molecules of the impinging precursor beam(s) stick to and migrate on the surface of substrate 120 and optionally react, if there is a binary or multi-nary composition, to form the desired composition. Owing to the difference in volatility of each precursor, different beams will have different fluxes.

Various optional detector systems, such as reflection high energy electron diffraction (RHEED) 110-111, ellipsometry 112-113, line-of-sight in-situ reflection mass spectrometer (REMS) 115, and the like, can be included in the MBE system 100. These optional detector systems provide information that can be useful during film growth. For example, the RHEED emitter 111 and pickup 110 permit assessment of the crystal quality and growth rate of the surface of substrate 120. The use of the ellipsometer source 112 and detector 113 enables layer thickness measurements. The use of a REMS device 115 provides information about the sticking coefficient and desorption of the atoms or molecules as a function of temperature.

Figure 2:
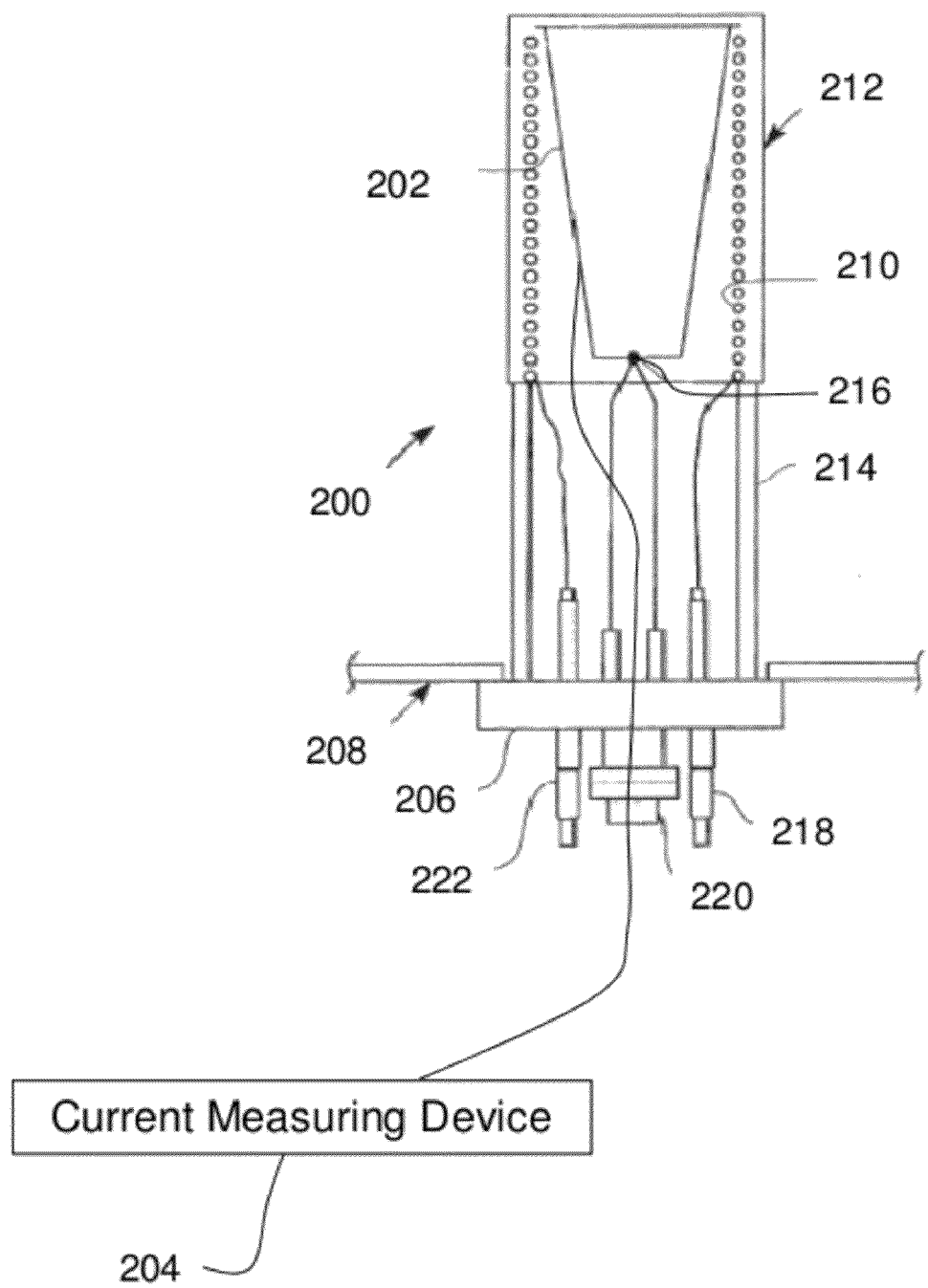
FIG. 2 is a schematic illustration of an effusion cell according to some embodiments of the present invention.

To obtain information regarding atomic or molecular flux, effusion cell(s), according to exemplary embodiments of the present invention, can include a current-measuring device. FIG. 2 is a schematic illustration of an effusion cell according to some embodiments of the present invention. The effusion cell, of FIG. 2, is generally designated 200. The effusion cell 200 includes an electrically conductive container 202. The electrically conductive container or device 202 can be a crucible, for example, that is configured to hold the source or precursor material (not shown). The effusion cell 200 can include a vacuum flange 206 for attachment to the vacuum chamber 208 within which the deposition is performed. The effusion cell 200 can also include a heat source, shown in FIG. 2 as a heating coil 210, proximate the electrically conductive container 202 to heat the precursor material. A heat shield 212 and supporting structure 214 can be attached to the flange 206 for use with the heat source 210 and electrically conductive container 202. A thermocouple 216 can be held with a spring in thermal communication with a portion of the electrically conductive container 202 as well.

When heated, some atoms in a source material can become thermally ionized. As such, some percentage of these atoms lose electrons to the bulk of the source material and are left with a net positive charge. When positively ionized atoms desorb from the surface of the bulk, this generates a small positive current flow from the source material. This current can be measured by the current-measuring device 204, which is in electrical communication with the electrically conductive container 202. Hermetically sealed vacuum electrical pass-throughs 218, 220, and 222 in flange 206 provide means for electrical connection of the heat source 210 to an external source of power (not shown) and of the thermocouple 216 with an external thermocouple readout instrument (also not shown).

The neutral atomic or molecular flux can be directly correlated, via an initial calibration step, to the amount of positively ionized atoms leaving the source material. This step is generally performed only once to establish the ion to neutral ratio for each precursor material. This initial calibration correlates the measured ion flux to one of many possible other measurables including, but not limited to, RHEED growth rate oscillations, a measured flux from an ion gauge flux monitor or quartz crystal monitor, simple measurements of the growth rate of the grown film using a commonly available thickness measurement and growth time, or the like. The last technique must be performed under conditions of negligible re-desorption of flux from the substrate (i.e., near unity sticking coefficient). Once the correlation of ion flux to any one of these measurables is performed, the ion flux to total flux correlation is known.

In general, an electrically conductive container can be formed from a variety of materials provided that the particular material chosen does not prevent the current measuring device from obtaining a measurement or reading. Exemplary materials include graphite, tungsten, silicon carbide, silicon, germanium, carbon, hafnium, rhenium, iridium, austenitic nickel-based superalloys such as those commercially sold under the trade name INCONEL, stainless steel, aluminum, tantalum, including alloys of any of the foregoing, and the like.

According to some embodiments of the invention, multiple components may be used in concert together to obtain the current measurements. As an example, such components can include an electrometer, solid state amplifier, lock-in amplifier, and the like. A lead from an electrometer can be placed in electrical contact with the electrically conductive container to obtain current measurements due to heating the source material. Other embodiment can utilize a lock-in amplifier (also known as a phase sensitive detector). A lock-in amplifier can extract a signal with a known carrier wave from a noisy environment. In this arrangement, a known input signal can be provided to an electrically conductive container such that the precursor material is biased with a signal of a known frequency. This known frequency can also be provided to a lock-in amplifier so that the lock-in amplifier can obtain current measurements at the known frequency. Advantageously, this configuration enables current measurements of various precursor materials at various known frequencies and provides high resolution current measurements. Additionally, this approach allows for suppression of interference from multiple effusion cells by choosing different excitation frequencies for each effusion cell.

It is important to note that if the source material is sufficiently heated, surface electrons can be provided with sufficient thermal energy to overcome the electrostatic forces binding them to the bulk. These thermionically emitted electrons generate a small negative current leaving the source material. Thus, for greater accuracy in the flux measurement, thermionic emissions are preferably minimized or eliminated. Reducing the thermionic emission of electrons can be achieved by decreasing the heat provided to the source material or by applying a bias voltage (AC and/or DC) to the electrically conductive container. However, if the source material were to be biased either positively or negatively, then some current could be leaked across the electrically conductive container to any surface in which the electrically conductive container is in contact or through a leaky insulating material comprising an insulator whose resistance is compromised by the elevated temperature. Thus, for improved accuracy in the flux measurement, this leakage current should also be minimized or eliminated.

Figure 3:
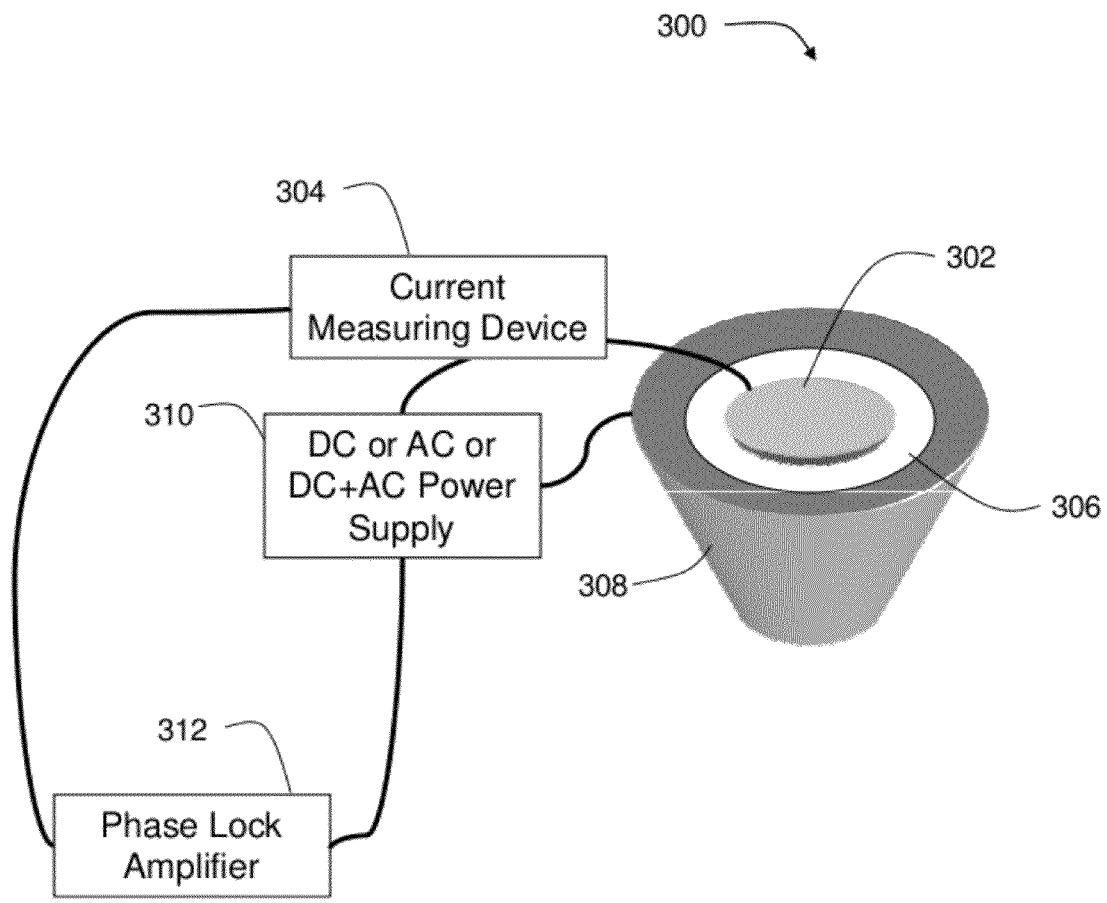
FIG. 3 is a schematic illustration of an effusion cell according to some embodiments of the present invention.

FIG. 3 is a schematic illustration of an effusion cell according to some embodiments of the present invention. Advantageously, this effusion cell 300 can be used to minimize or eliminate thermionic emissions and leakage current. In addition to the electrically conductive container 302 and current measuring device 304, this multi-layered effusion cell 300 further includes a dielectric shield 306 that surrounds the outer portion of the electrically conductive container 302. The material forming the dielectric shield 306 can be coated directly on the electrically conductive container 302 or can be a sleeve or housing the holds the electrically conductive container 302. Alternatively, the electrically conductive container 302 can be a coating on the interior surface of the dielectric shield 306. Many insulating materials can be used to form the dielectric shield 306. Exemplary materials include pyrolytic boron nitride, alumina, sapphire, silicon carbide, zirconia and/or beryllium oxide, or other similar dielectric vacuum compatible insulating material. If the materials are adhered to each other as in a coating, similar thermal expansion coefficients are desirable; otherwise temperature, vacuum, and minimal impurity compatibility would be preferred.

The dielectric shield 306 can optionally be surrounded by an outer electrically conductive layer 308. The outer electrically conductive layer 308 can be in the form of a coating on the dielectric shield 306 or a sleeve or housing that holds the dielectric shield 306 and electrically conductive container 302. The outer electrically conductive layer 308 can be formed from the same or a different material than that which is used to form the electrically conductive container 302.

The design of such a multi-layered effusion cell 300 helps to minimize the effects of current leakage and/or thermionic emission. Indeed, the dielectric shield 306 acts as an insulator and the outer electrically conductive layer 308 acts as a guard terminal. Specifically, during operation of the multi-layered effusion cell 300, the electrically conductive container 302 and outer electrically conductive layer 308 can be biased at the same potential using any combination of DC and/or AC voltages using separate lead wires from an AC and/or DC power supply 310. Since the electrically conductive container 302 and outer electrically conductive layer 308 are biased at the same potential, there should be no current flow through the dielectric shield 306, thereby reducing or eliminating leakage currents.

By placing a sensitive current measuring device 304 in the lead wire to the electrically conductive container 302, small electrical currents can be measured. When a positively charged atom desorbs from the electrically conductive container 302, one or more electrons are left behind. To maintain the bias of the electrically conductive container, residual electrons will be drawn out of the crucible through the lead wire and will be detected as a small current by the current measuring device 304. Owing to conservation of charge requirements, this measured current must be equal and opposite the ionic current from the charged material leaving the electrically conductive container 302. This current measurement can be related directly to the overall flux of material leaving the effusion cell 300 as described above. Thus, when necessary for a particular source material or for greater control over the thin film deposition, the multi-layered effusion cell 300 can be advantageous, and thus desired.

An optional bias voltage can be applied using AC and/or DC to the electrically conductive container 302. Provision of such a bias voltage can also enable provision of a phase locked signal for further sensitivity and resolution. Indeed, as mentioned above, providing an AC bias signal to the electrically conductive container 302 in concert with a phase-lock amplifier 312 and optionally supplying the same AC bias independently to the outer electrically conductive layer 308 enables measuring specific flux currents associated with a specific material. In certain embodiments of the present invention, multiple unique AC bias signals can each be provided to a unique container containing different precursor materials. By using a phase-lock amplifier to measure flux currents at these different unique AC signal frequencies, advantageously, it is possible to obtain flux current measurements for each of the different precursor materials.

Figure 4:
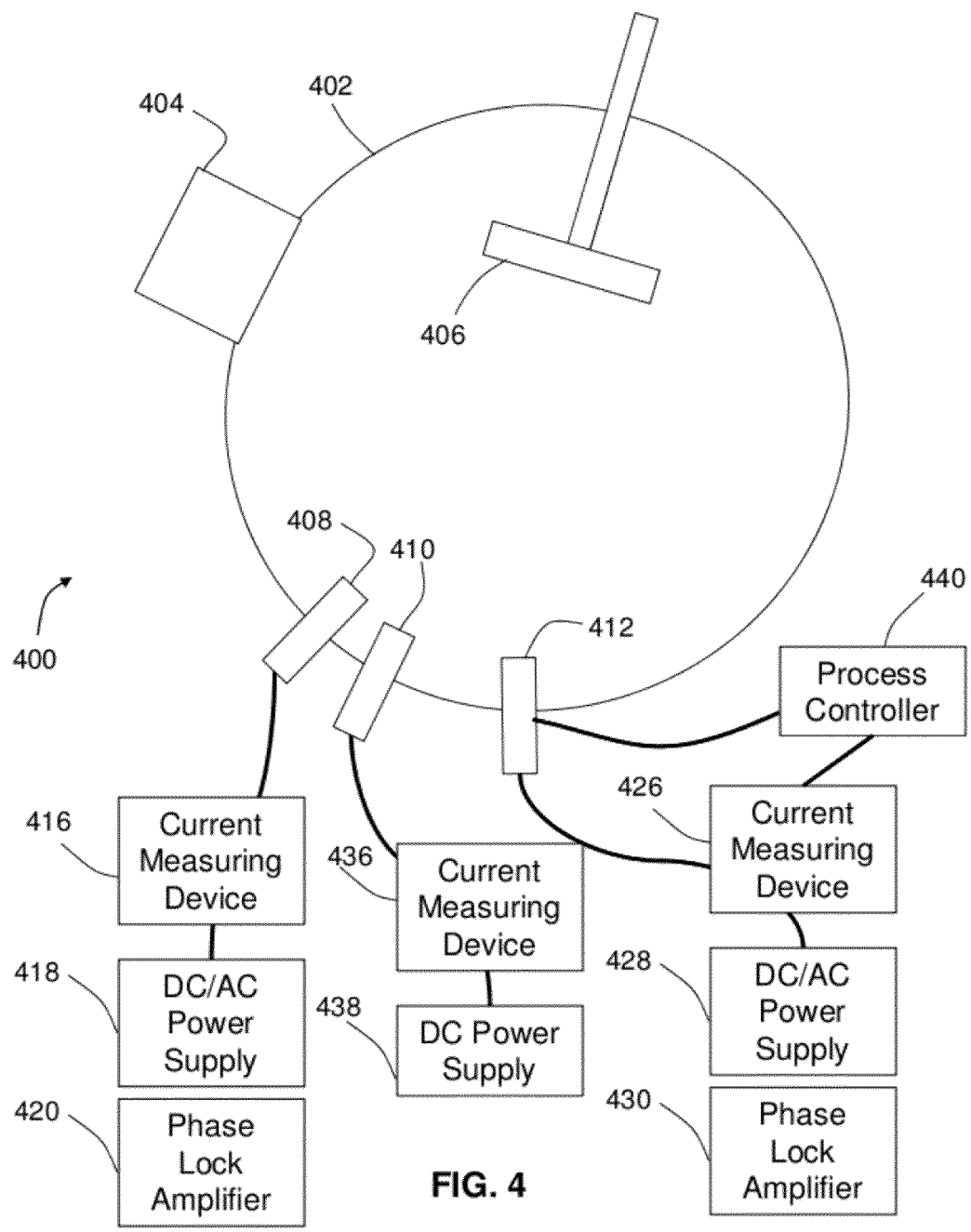
FIG. 4 is a schematic illustration of system to measure in-situ molecular flux density according to some embodiments of the present invention.

The effusion cells described above can be used in the MBE system 100 illustrated in FIG. 1 to measure the in-situ molecular flux for a plurality of effusion cells. FIG. 4 is a schematic illustration of such a system according to some embodiments of the present invention. The MBE system 400 includes a vacuum chamber 402 with a valve 404 for attaching a vacuum pump. Three effusion cells 408, 410, and 412, are included and aimed at a substrate 406. The effusion cells are each independently in electrical communication with a power supply 418, 428, and 438, and/or a phase lock amplifier 420 and 430 as well as a current measuring device 416, 426, and 436. The effusion cells 408, 410, and 412, can be used in a closed-loop control system to provide in-situ flux control and stability by feeding an amplified current signal to a process controller 440. Process controllers for MBE systems are known in the art; thus for brevity this information is not provided herein.

The process controller can manipulate many variable deposition parameters (e.g., source material temperature, effusion cell shutter position, vacuum pressure, substrate rotation or motion, substrate temperature, and the like) to exert control over, for example, the growth rate and composition of the deposited material. For simplicity, the process controller and its operative communication with each of the effusion cells, substrate, vacuum pump, and the like are not shown. As shown in FIG. 4, each of the effusion cells 408, 410, and 412 can be operated with a corresponding current measuring device, AC/DC signal supply, and/or phase lock amplifier in accordance with some preferred embodiments. It should be understood, however, that the effusion cells 408, 410, and 412 can be operated without an AC bias voltage and/or with differing AC and/or differing DC voltages and/or phase lock detectors to discriminate between electrical signals from different effusion cells within a single MBE system according to other embodiments.

In a deposition system, it is possible for a sensitive current measuring device to be affected by sources of noise, crosstalk, and/or interference. Further, given the size of such current measuring devices, it would be more convenient to place the current measuring device outside of the deposition chamber. To minimize or eliminate the effects of noise, cross-talk, and interference as well as to minimize having to change the design of the deposition chamber, the effusion cells described herein can be modified to include a tri-axial feed-through and tri-axial electrical cabling. A tri-axial cable is a type of electrical cable similar to coaxial cable, but with the addition of an extra layer of insulation and a second conducting sheath. It provides greater bandwidth and rejection of interference than other cables.

Figure 5:
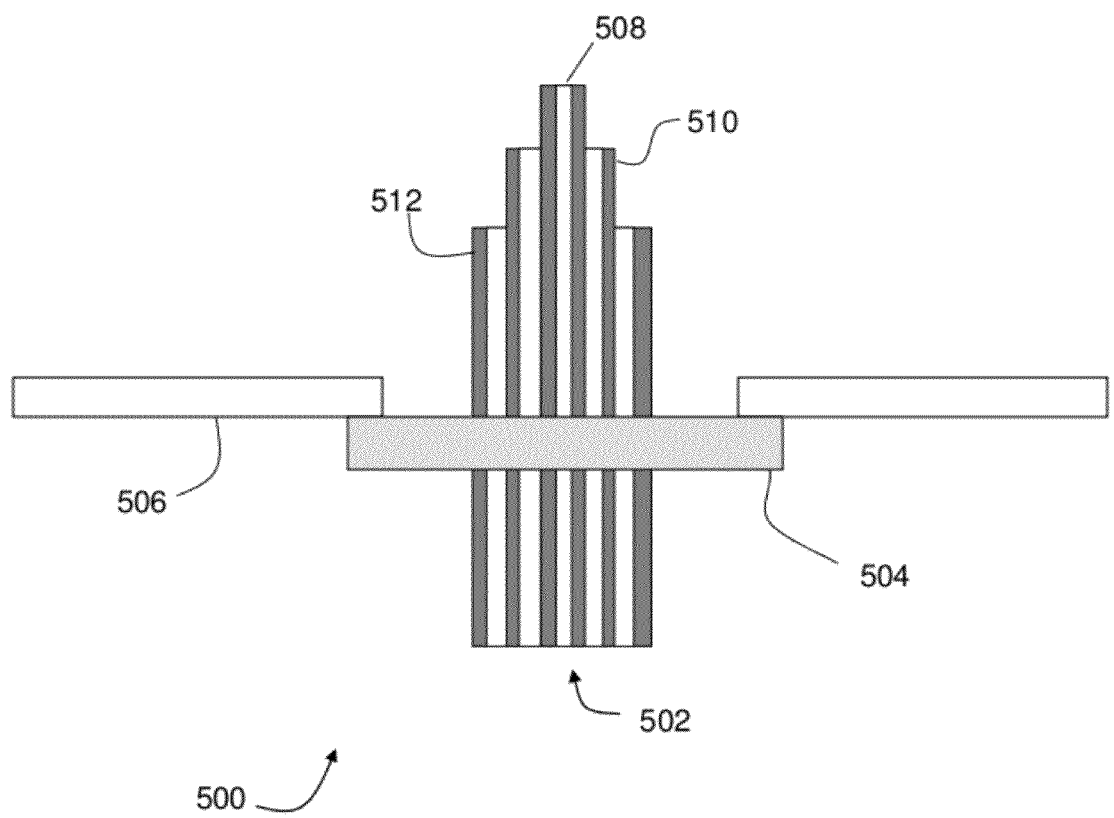
FIG. 5 is a schematic illustration of a tri-axial feed-through used in accordance with some embodiments of the present invention.

FIG. 5 is a schematic illustration of a portion of an effusion cell 500 having a tri-axial feed-through 502 used in accordance with some embodiments of the present invention. As shown in FIG. 5, the effusion cell 500 can include a vacuum flange 504 for attachment to the vacuum chamber 506 of the deposition system. The flange 504 includes an orifice through which the tri-axial feed-through 502 is inserted.

The tri-axial feed-through 502 includes three sections: an inner 508, an intermediate 510, and an outer 512. Each section includes a conductor material (white) and an insulating shield (grey). For example, a first dielectric shield is disposed between the inner conductor and the intermediate conductor, and a second dielectric is disposed between the intermediate conductor and the outer conductor. The conductor and the shield of the inner section 508 are kept at the same potential. Thus, the leakage current in the inner section 508 is zero or about zero. Instead, any leakage that may occur happens between the shields of the inner section 508 and outer section 512. This does not affect the current measurement because it is the conductor of the inner section 508 that is connected to the electrically conductive container and only the current flowing along the conductor of the inner section 508 is being measured.

According to some preferred embodiments of the present invention, an AC and/or DC bias input can be provided using the tri-axial feed-through 502. Owing to any noise in the environment, use of a tri-axial feed-through 502 enables provision of an AC signal without the AC signal being affected by the noisy environment. This is because a tri-axial arrangement provides two concentric shields. In some embodiments, a bias can be provided with a co-axial input line (having a center conductor and shield) and then using the exterior of the chamber as a third shield (or outer section), the input line can be modified into a tri-axial arrangement. In other words, the exterior of the chamber can be coupled to the conductor of the outer section 512 of the tri-axial feed through 502, the shield of the input co-axial line can be coupled to the intermediate conductor of the tri-axial feed through, and the center conductor of the co-axial input can be coupled to the conductor of the inner section 508 of the tri-axial feed through 502.

Figure 6:
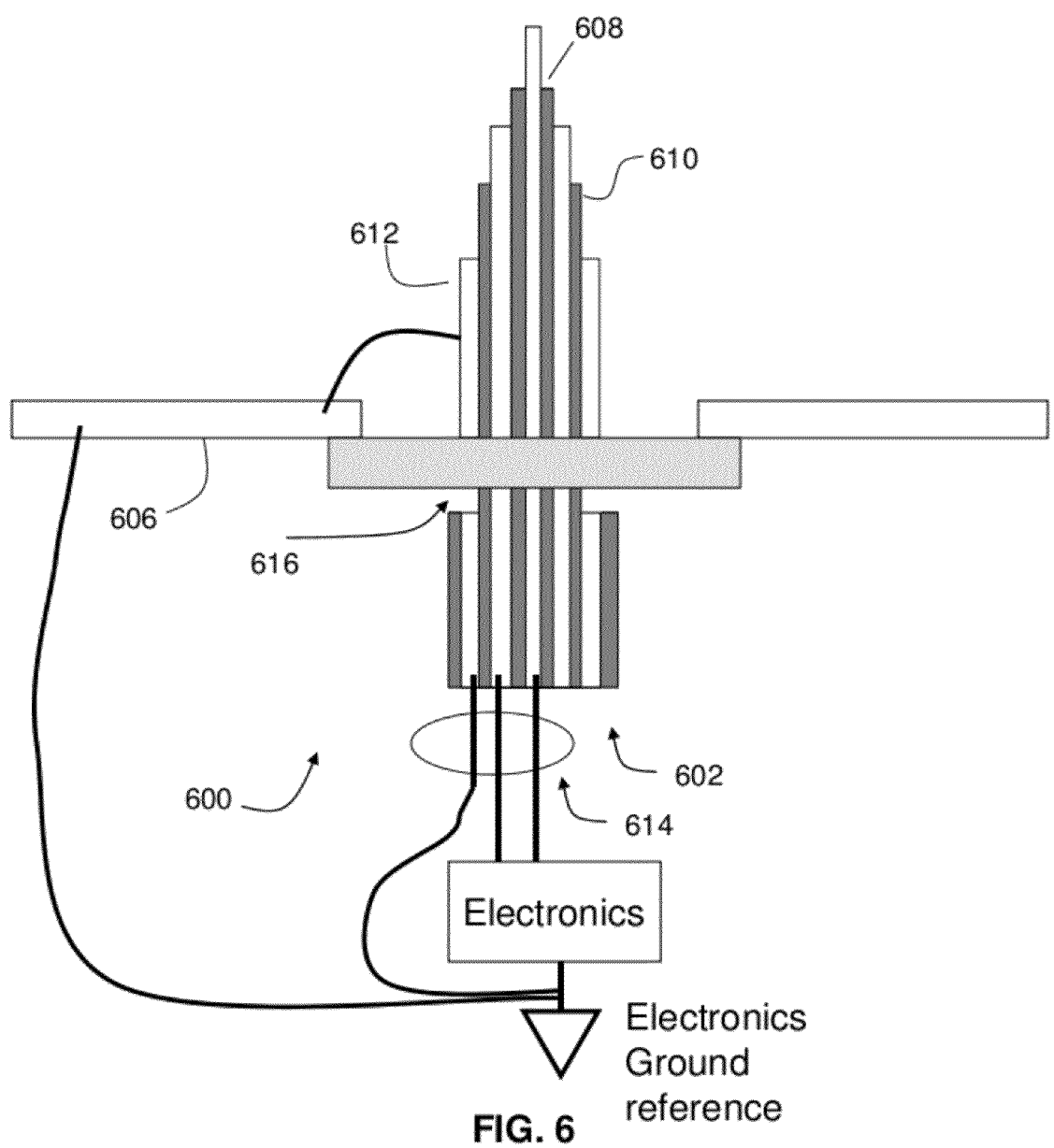
FIG. 6 is a schematic illustration of a tri-axial feed-through used in accordance with some embodiments of the present invention.

FIG. 6 also shows additional features pertaining to tri-axial feed through. For example, given that the chamber 606 is under a vacuum, it is imperative that any chamber input or output not disturb the vacuum. In light of this, the inventors have prepared a tri-axial feed through 600 to preserve the vacuum. This arrangement of three encapsulated conductors 608, 610 and 612 maintains tri-axial shielding throughout the interface all the way to the destination, while maintaining vacuum integrity. This arrangement eliminates small current flow in the outer ground circuit that would otherwise cause the electrical measurement to drift in response to environmental electromagnetic interference. Currents flowing in the ground circuit are commonly known as ground loops. The design uses an electrically isolated coaxial design 608 and 610 interior to the vacuum, with an additional shield 612 surrounding the coaxial assembly 608 and 610. This additional outer shield 612 can also be connected to the vacuum chamber 606 ground. The connection of the shield outside of vacuum 616 is electrically broken from 600 with as small of an electrical gap as practical. This electrical break prevents the ground loop currents from flowing and disrupting the ion current measurements. The air side of shield 612 is connected through the electronics (i.e., the ground reference of chamber 606 is connected to the ground reference of the current measuring device). In this way, the shield circuit is connected in a "broken loop" configuration. The interior wiring of the effusion cell, which includes the tri-axial feed-through 600 is implemented using a series of electrically conductive materials and insulators arranged in a so-called "clam shell" design as shown in FIG. 7.

Figure 7:
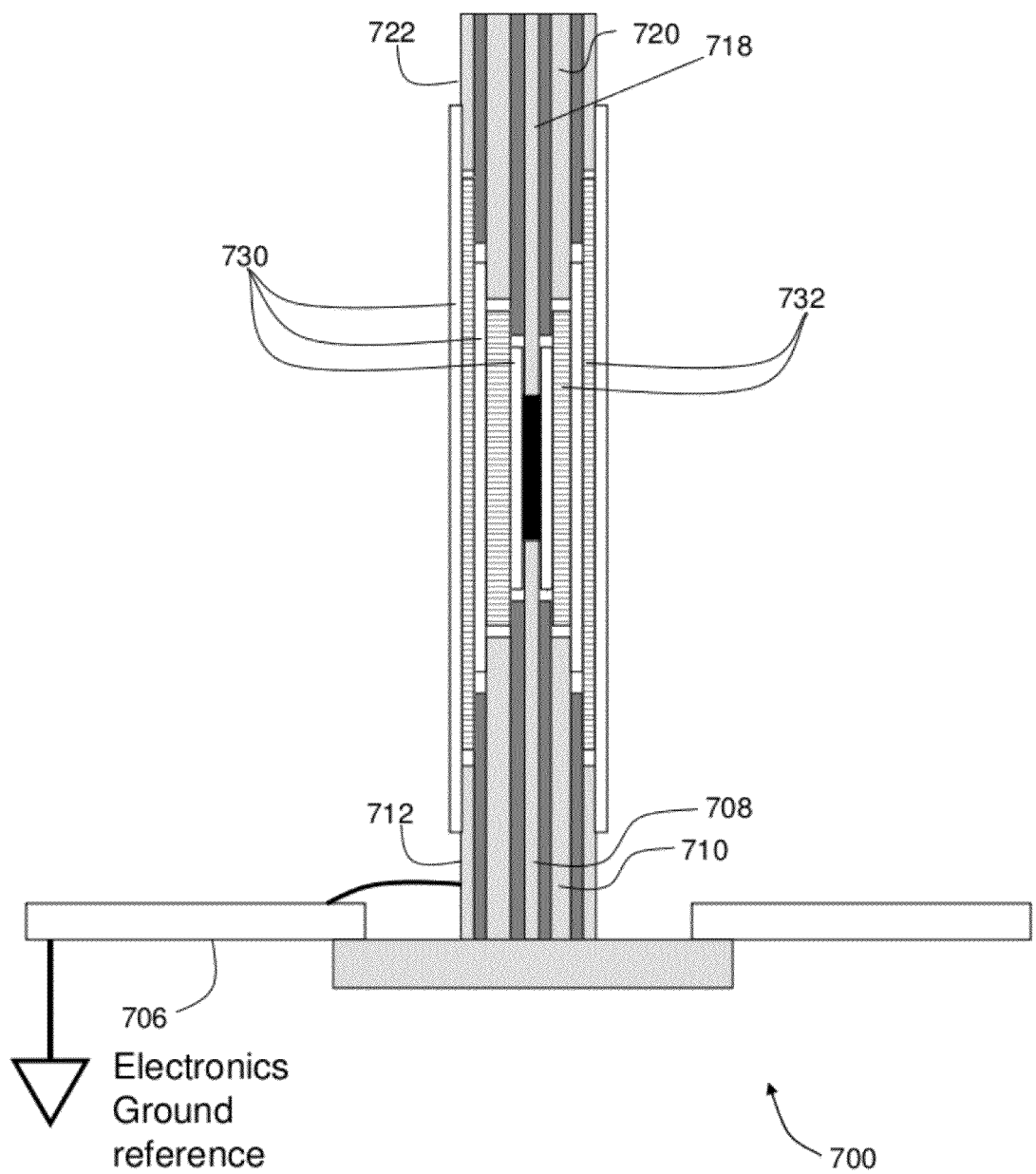
FIG. 7 is a schematic illustration of a tri-axial feed-through used in accordance with some embodiments of the present invention.

FIG. 7 illustrates the vacuum side connections of the tri-axial feed-through (i.e., within the vacuum chamber 706). More specifically, the three encapsulated conductors 608, 610 and 612 of FIG. 6 correspond to conductors 708, 710 and 712 of FIG. 7. Tri-axial connectors 718, 720 and 722 lead to the electrically conductive container (not shown). The tri-axial feed-through conductors 708, 710 and 712 are connected to the tri-axial conductors of the electrically conductive container 718, 720 and 722 through a tri-axial interconnection having the clam-shell design. The tri-axial interconnection includes alternating metallic 730 and insulating 732 clam-shells. The clam-shell design serves a dual purpose, both maintaining complete shielding and guarding of the conductors as well as ensuring ease of construction and maintenance for the device. Given current limitations of construction of coaxial feed-throughs for vacuum applications, the clam-shell is a novel way of achieving a fully vacuum compatible tri-axial transition.

Figure 8:
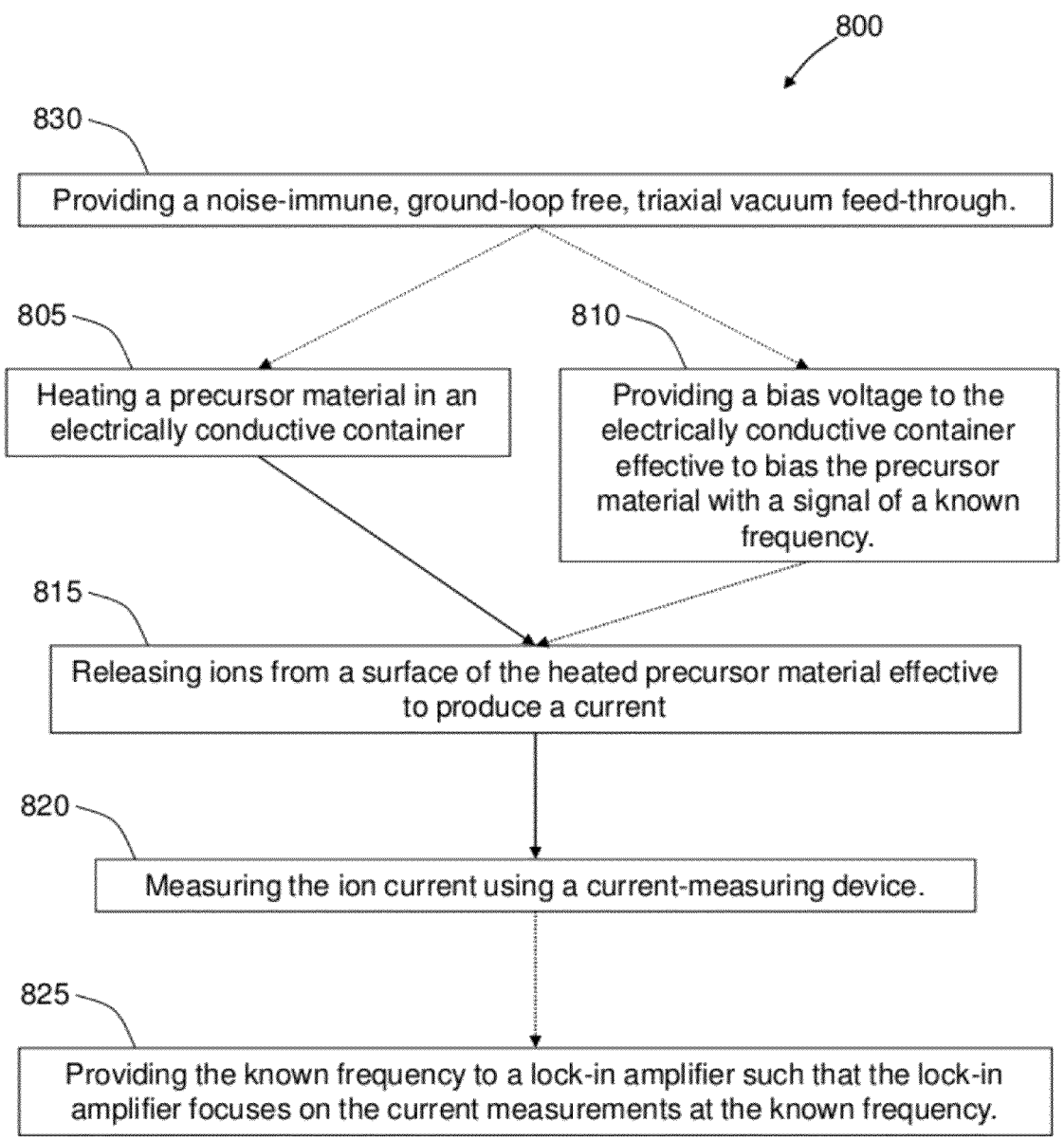
FIG. 8 illustrates a logical flow diagram of a method embodiment of measuring in-situ molecular flux density according to some embodiments of the present invention.
Figure 9:
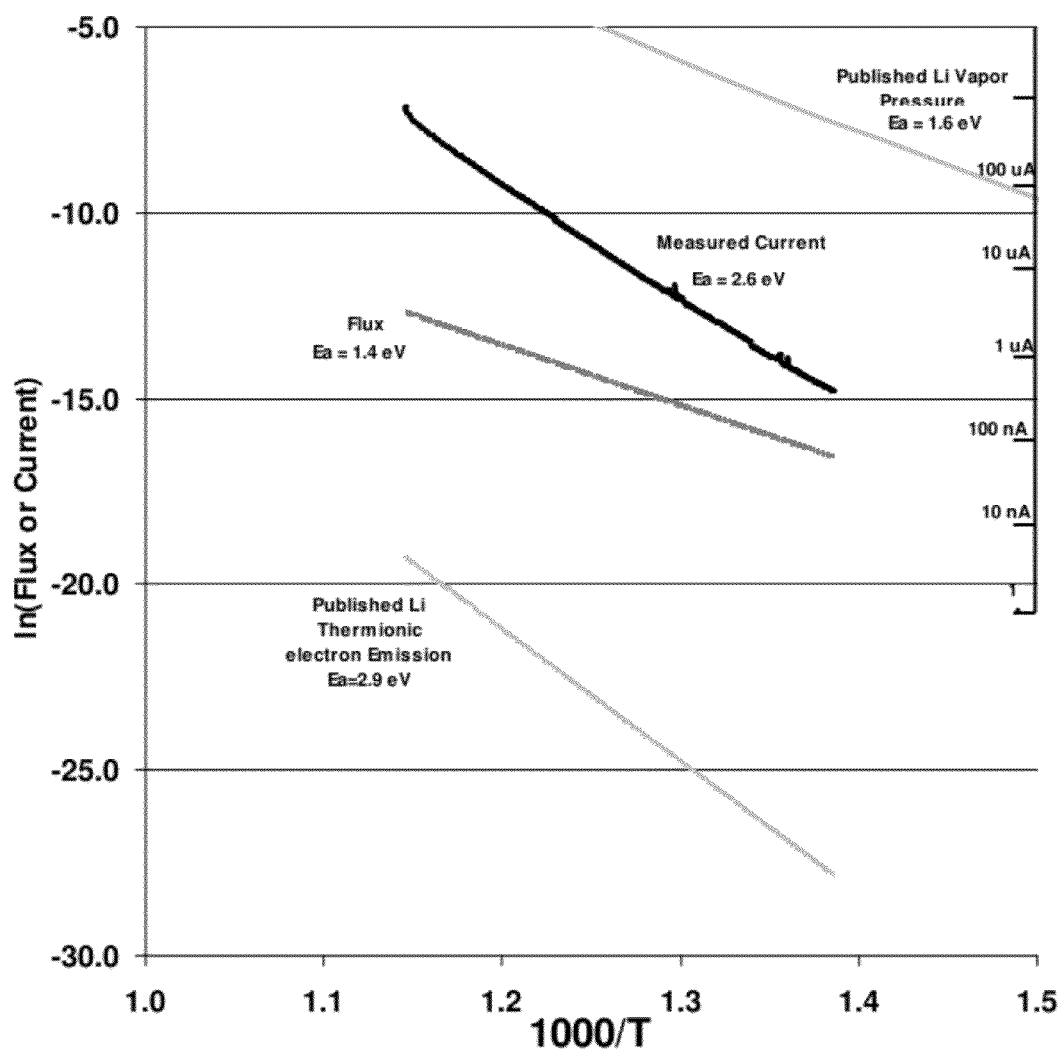
FIG. 9 is a graphical representation of measured effusion cell currents for various samples.

FIG. 8 illustrates a logical flow diagram of a method of measuring in-situ molecular flux density according to some embodiments of the present invention. The method 800 generally includes heating a source or precursor material in an electrically conductive container 805, thermally ionizing (i.e., releasing ions from) the heated precursor material such that an ion current is produced 815, and measuring the ion current using a current-measuring device 820. The flux can then be directly correlated to the amount of positively ionized atoms leaving the source material.

In addition, a known input signal, such as a bias voltage, can optionally be provided to the electrically conductive container such that the source material is biased with a signal of a known frequency 810. This known frequency can also be provided to a lock-in amplifier so that the lock-in amplifier can obtain current measurements at the known frequency 825. This allows for current measurements of various heated precursor materials at various known frequencies and enables high resolution current measurements.

The present invention is exemplified by the following non-limiting examples.

EXAMPLE

Lithium was evaporated from a tungsten container with the container's ion current measured via an electrometer (Keithley). The current was monitored as a function of cell temperature and found to behave in an "Arrhenius behavior" (i.e., having a linear slope on a log(current) versus 1/Temperature plot) for more than 2.5 orders of magnitude. This Arrhenius behavior is indicative of a thermally excited process indicating ion current tracks the exponential of 1/(effusion cell temperature). In order to confirm that the measured current was due to ion current from the effusion cell, the electrometer was then connected to a metal collector in front of the effusion cell and the ion flux was monitored as a function of bias on the metal collector, temperature of the effusion cell, and DC bias on the effusion cell. All monitored current vs. metal collector bias data indicated a rectified current-voltage characteristic commonly known for vacuum electronics but with the polarity indicating that positive metal collector bias resulted in reduced current indicating repulsion of positive ions.

With the effusion cell floating (unbiased and disconnected from ground) all collector current voltage characteristics were identical for all effusion cell temperatures indicating charge neutrality and thus no net current (electron emission balances positive ion emission). With the crucible connected to ground, the collector current voltage characteristics exhibited a weak dependence on the effusion cell temperature indicating partial compensation of the ion charge by thermionic emission of electrons. However, when a small positive DC bias was added to the effusion cell so as to suppress thermionic emission of electrons, the collector current showed an extremely strong dependence on effusion cell temperature confirming the operation as a positive ion emission monitor. Furthermore the collector ion current could be modulated by interrupting the ion beam with the effusion cell shutter. Thus, operation of the positive ion current monitor was confirmed.

The initial results described for lithium were obtained for DC biases only and achieved stable ion flux readings to 3 or 4 significant digits. The same setup was duplicated for indium flux measurements but with the additional features, including the above-described tri-axial connections as well as guards on the effusion cell. It was found that much lower noise limits could be obtained. For example, the lower limit on the noise was less than about 1 picoampere even with the effusion cell very hot). Additionally, a steady 4 digits of accuracy was obtained even though the measured current for indium was about 6 decades smaller than that for lithium.

In the example above, the flux from Li-based and metallic In sources were monitored. However, it should be recognized that any source material can be used with similar results. Indeed, the enormous dynamic range of the flux measuring devices, methods, and systems disclosed herein enable use with a variety of materials. It is not necessary that the source material be a solid. For example, metal-organic precursors can be used so long as a current can be measured across the container in which the precursor or source is placed. Using phase-sensitive detection, as described above, at frequencies of about few Hertz to about a few kilohertz, up to about 6 significant digits or more of ion flux stability can be achieved.

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof. For example, temperature and pressure parameters may vary depending on the particular materials used.

Therefore, while embodiments of this disclosure have been described in detail with particular reference to exemplary embodiments, those skilled in the art will understand that variations and modifications can be effected within the scope of the disclosure as defined in the appended claims. Accordingly, the scope of the various embodiments of the present invention should not be limited to the above discussed embodiments, and should only be defined by the following claims and all equivalents.

We claim:

1. An in-situ device to measure flux in a deposition system, the device comprising:
   an electrically conductive container configured to hold a precursor material;
   a heat source proximate the electrically conductive container to heat the precursor material to release ions such that an ion current is produced; and
   a current-measuring device in electrical communication with the electrically conductive container to measure the ion current associated with the heated precursor material.

2. The device of claim 1, further comprising an input signal provided to the electrically conductive container, the input signal having a predetermined phase and the current-measuring device configured to measure the ion current at the predetermined phase.

3. The device of claim 1, further comprising an input signal and a vacuum coupler, the vacuum coupler being disposed between the input signal and the electrically conductive container to couple the input signal and the electrically conductive container, and the vacuum coupler configured to maintain a vacuum.

4. The device of claim 1, further comprising a process controller operatively connected to the current-measuring device and the heat source, the process controller configured to control the heat source responsive to the measured current associated with the heated precursor material.

5. The device of claim 1, further comprising a dielectric shield surrounding a portion of the electrically conductive container where no precursor material is held, and an outer electrically conductive layer surrounding the dielectric shield.

6. The device of claim 1, wherein the device is an effusion cell for a molecular beam epitaxy system.

* * * * *